(12) United States Patent
Shaeffer et al.

(10) Patent No.: US 8,352,805 B2
(45) Date of Patent: Jan. 8, 2013

(54) MEMORY ERROR DETECTION

(75) Inventors: Ian Shaeffer, Los Gatos, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 658 days.

(21) Appl. No.: 12/424,094

(22) Filed: Apr. 15, 2009

(65) Prior Publication Data

US 2009/0235113 A1 Sep. 17, 2009

Related U.S. Application Data

(63) Continuation-in-part of application No. 12/035,022, filed on Feb. 21, 2008, now Pat. No. 7,836,378, which is a continuation of application No. 11/436,284, filed on May 18, 2006.

(51) Int. Cl.
*G06F 11/00* (2006.01)

(52) U.S. Cl. .......... 714/53; 714/6.11; 714/6.24; 714/52; 714/54

(58) Field of Classification Search .................. 714/6.11, 714/6.24, 52, 53, 54, 702, 805
See application file for complete search history.

(56) References Cited

U.S. PATENT DOCUMENTS

| | | | |
|---|---|---|---|
| 3,893,072 A | 7/1975 | D'Antonio | |
| 4,054,911 A | 10/1977 | Fletcher et al. | |
| 4,162,536 A | 7/1979 | Morley | |
| 4,354,225 A | 10/1982 | Frieder et al. | |
| 4,363,125 A | 12/1982 | Brewer | |
| 4,369,510 A | 1/1983 | Johnson et al. | |
| 4,394,763 A | 7/1983 | Nagano et al. | |
| 4,456,993 A | 6/1984 | Taniguchi et al. | |
| 4,468,731 A | 8/1984 | Johnson et al. | |
| 4,527,237 A | 7/1985 | Frieder | |
| 4,535,455 A | 8/1985 | Peterson | |
| 4,543,628 A | 9/1985 | Pomfret | |
| 4,596,014 A * | 6/1986 | Holeman | 714/805 |
| 4,597,084 A * | 6/1986 | Dynneson et al. | 714/805 |
| 4,604,750 A | 8/1986 | Manton et al. | |
| 4,648,064 A | 3/1987 | Morley | |
| 4,888,773 A | 12/1989 | Arlington | |
| 4,914,657 A | 4/1990 | Walter et al. | |
| 4,920,539 A | 4/1990 | Albonesi | |
| 4,970,714 A | 11/1990 | Chen | |
| 5,070,474 A | 12/1991 | Tuma et al. | |
| 5,173,905 A * | 12/1992 | Parkinson et al. | 714/768 |
| 5,218,691 A | 6/1993 | Tuma et al. | |
| 5,341,251 A | 8/1994 | Fincher et al. | |
| 5,347,643 A | 9/1994 | Kondo et al. | |
| 5,392,302 A * | 2/1995 | Kemp et al. | 714/805 |
| 5,404,361 A | 4/1995 | Casorso et al. | |
| 5,450,609 A | 9/1995 | Schultz et al. | |
| 5,488,691 A | 1/1996 | Fuoco et al. | |

(Continued)

OTHER PUBLICATIONS

Qimonda. "Qimonda GDDR5—White Paper", Aug. 2007.*

(Continued)

*Primary Examiner* — Joshua P Lottich (57) ABSTRACT

Systems and methods are provided for detecting and correcting address errors in a memory system. In the memory system, a memory device generates an error-detection code based on an address transmitted via an address bus and transmits the error-detection code to a memory controller. The memory controller transmits an error indication to the memory device in response to the error-detection code. The error indication causes the memory device to remove the received address and prevent a memory operation.

30 Claims, 6 Drawing Sheets

U.S. PATENT DOCUMENTS

| | | | |
|---|---|---|---|
| 5,490,153 | A | 2/1996 | Gregg |
| 5,502,733 | A | 3/1996 | Kishi |
| 5,553,231 | A | 9/1996 | Papenberg |
| 5,559,956 | A | 9/1996 | Sukegawa |
| 5,588,112 | A | 12/1996 | Dearth et al. |
| 5,687,183 | A | 11/1997 | Chesley |
| 5,729,550 | A | 3/1998 | Nakajima et al. |
| 5,751,932 | A | 5/1998 | Horst |
| 5,751,955 | A | 5/1998 | Sonnier |
| 5,778,419 | A | 7/1998 | Hansen et al. |
| 5,828,677 | A | 10/1998 | Sayeed et al. |
| 5,841,795 | A * | 11/1998 | Olarig et al. ......... 714/768 |
| 5,987,628 | A | 11/1999 | Von Bokern |
| 6,003,151 | A | 12/1999 | Chuang |
| 6,009,542 | A * | 12/1999 | Koller et al. ......... 714/53 |
| 6,012,136 | A | 1/2000 | Brown |
| 6,038,679 | A | 3/2000 | Hanson |
| 6,065,146 | A | 5/2000 | Bosshart |
| 6,081,145 | A | 6/2000 | Bandai et al. |
| 6,094,732 | A * | 7/2000 | Takano ......... 714/53 |
| 6,115,763 | A | 9/2000 | Douskey |
| 6,125,470 | A | 9/2000 | Hee et al. |
| 6,151,689 | A | 11/2000 | Garcia et al. |
| 6,169,710 | B1 | 1/2001 | Arai |
| 6,189,123 | B1 | 2/2001 | Nystrom |
| 6,208,663 | B1 | 3/2001 | Schramm et al. |
| 6,212,660 | B1 | 4/2001 | Joeressen et al. |
| 6,308,294 | B1 | 10/2001 | Ghosh |
| 6,314,541 | B1 | 11/2001 | Seytter |
| 6,367,048 | B1 * | 4/2002 | McAuliffe et al. ......... 714/758 |
| 6,373,842 | B1 | 4/2002 | Coverdale et al. |
| 6,393,504 | B1 | 5/2002 | Leung et al. |
| 6,397,365 | B1 | 5/2002 | Brewer et al. |
| 6,438,723 | B1 | 8/2002 | Kalliojarvi |
| 6,507,928 | B1 | 1/2003 | Richardson |
| 6,606,589 | B1 | 8/2003 | Tuma et al. |
| 6,625,749 | B1 | 9/2003 | Quach |
| 6,697,986 | B2 | 2/2004 | Kim et al. |
| 6,700,867 | B2 | 3/2004 | Classon et al. |
| 6,704,898 | B1 | 3/2004 | Furuskar et al. |
| 6,725,414 | B2 | 4/2004 | Seyyedy |
| 6,745,364 | B2 | 6/2004 | Bhatt et al. |
| 6,754,856 | B2 | 6/2004 | Cofler et al. |
| 6,765,740 | B2 | 7/2004 | Tsuchiya |
| 6,779,148 | B2 | 8/2004 | Tanaka |
| 6,792,501 | B2 | 9/2004 | Chen et al. |
| 6,851,081 | B2 | 2/2005 | Yamamoto |
| 6,883,130 | B2 | 4/2005 | Wilhelmsson |
| 6,912,682 | B1 | 6/2005 | Aoki |
| 6,941,493 | B2 * | 9/2005 | Phelps ......... 714/53 |
| 6,977,888 | B1 | 12/2005 | Frenger et al. |
| 6,990,604 | B2 | 1/2006 | Binger |
| 7,200,770 | B2 | 4/2007 | Hartwell et al. |
| 7,231,580 | B2 | 6/2007 | Shiota et al. |
| 7,339,759 | B2 | 3/2008 | Hashimoto |
| 7,340,641 | B1 | 3/2008 | Binger |
| 7,355,803 | B2 | 4/2008 | Yang |
| 7,418,436 | B2 | 8/2008 | Maeda et al. |
| 7,421,547 | B2 | 9/2008 | Matsui et al. |
| 7,519,894 | B2 | 4/2009 | Weib et al. |
| 7,523,381 | B2 * | 4/2009 | Eggleston et al. ......... 714/773 |
| 7,529,965 | B2 | 5/2009 | Ikeuchi et al. |
| 7,548,495 | B2 | 6/2009 | Kobayashi |
| 7,562,285 | B2 | 7/2009 | Yang et al. |
| 7,624,298 | B2 | 11/2009 | Kasahara et al. |
| 7,831,882 | B2 | 11/2010 | Tsern et al. |
| 7,831,888 | B2 | 11/2010 | Wang |
| 7,836,386 | B2 * | 11/2010 | Schumacher et al. ......... 714/798 |
| 7,882,423 | B2 | 2/2011 | Wang |
| 7,949,931 | B2 | 5/2011 | Lastras-Montano |
| 8,042,023 | B2 * | 10/2011 | Balb ......... 714/768 |
| 8,132,077 | B2 | 3/2012 | Yang et al. |
| 2002/0053042 | A1 | 5/2002 | Brown |
| 2003/0115417 | A1 | 6/2003 | Corrigan |
| 2004/0073649 | A1 | 4/2004 | Inami et al. |
| 2004/0088497 | A1 | 5/2004 | Deans et al. |
| 2004/0139310 | A1 | 7/2004 | Maeda et al. |
| 2004/0205433 | A1 | 10/2004 | Gower et al. |
| 2004/0237001 | A1 | 11/2004 | Schulz et al. |
| 2004/0264030 | A1 | 12/2004 | Yang |
| 2005/0055522 | A1 | 3/2005 | Yahi |
| 2005/0073899 | A1 | 4/2005 | Gallivan et al. |
| 2006/0075291 | A1 | 4/2006 | Takahashi |
| 2006/0077750 | A1 | 4/2006 | Pescatore |
| 2006/0098320 | A1 | 5/2006 | Koga |
| 2006/0123483 | A1 | 6/2006 | Cohen |
| 2006/0126460 | A1 | 6/2006 | Kobayashi |
| 2007/0002482 | A1 | 1/2007 | Daikokuya et al. |
| 2007/0043917 | A1 | 2/2007 | Matsui et al. |
| 2007/0150872 | A1 | 6/2007 | Vohra |
| 2007/0162825 | A1 | 7/2007 | Wang et al. |
| 2008/0046802 | A1 * | 2/2008 | Honda ......... 714/805 |
| 2009/0006863 | A1 | 1/2009 | Mizuno |
| 2009/0204871 | A1 * | 8/2009 | Eggleston et al. ......... 714/763 |
| 2010/0217915 | A1 | 8/2010 | O'Connor et al. |
| 2011/0246857 | A1 * | 10/2011 | Bae et al. ......... 714/763 |

OTHER PUBLICATIONS

Kilbuck, Kevin, et al., "Fully Buffered DIMM—Unleashing Server Capacity", Micron Technology, Inc., Apr. 8, 2005.

Siewiorek, Dan., Lecture Handout "20 Fault Tolerance & Memory Hierarchy", Carnegie Mellon University, Nov. 23, 1998.

May, Phil, et al., "HiPER: A Compact Narrow Channel Router with Hop-by-Hop Error Correction", IEEE Transactions on Parallel and Distributed Systems, vol. 13, No. 5, May 2002, pp. 485-498.

Digital Equipment Corp., "Software Production Description, Product Name: HSC Software, Ver. 6.5", Jun. 1992.

"Foward error correction", Wikipedia, http://en.wikipedia.org/wiki/forward_error_correction.

"Serial ATA II: Electrical Specification," Dell Computer Corp., et al., Rev. 1, May 26, 2004. 187 pages.

"ECC Memory," Answers.com, http://www.answers.com/topic/eec-memory, obtained Jun. 20, 2006. 2 pages.

Grosspietsch, K.E., et al., "The VLSI Implementation of a Fault-Tolerant Memory Interface—a Status Report," VLIS '85, Horbst (Editor), 1986, pp. 155-164. 10 pages.

Geisler, J., "Error Detection & Correction," Taylor University, Computer & System Sciences Dept., Sep. 16, 2005.

Cardarilli, G.C., et al., "Design of a Fault Tolerant Solid State Mass Memory," IEEE Transactions of Reliability, vol. 52, No. 4, Dec. 2003, pp. 476-491. 16 pages.

"Hardware Documentation—Machines DEC—VAX Hardware Reference," printed from http://www.netbsd.org/documentation/hardware/Machines/DEC/vax, printed on May 13, 2005. 91 pages.

Hanna, P., Lecture 9 "Error Detection and Correction," Queen's University-Belfast, Jan. 3, 2005.

"Error Detection and Correction," Logic and Computer Design Fundamentals, 3rd Ed., Pearson Education, 2004, pp. 1-5.

Grosspietsch, K.E., et al., "A Memory Interface Chip Designed for Fault Tolerance," VLSI System Design, Jun. 1987, pp. 112-118. 5 pages.

Haas, Jon, et al., "Advances in Server Memory Technology," presented at Spring 2005 Intel Developers Forum, San Francisco, CA, Mar. 1, 2005. 31 pages.

Hodgart, M.S., et al., "A (16,8) Error Correcting Code (T=2) for Critical Memory Applications," DASIA2000, Montreal, Canada, May 22-26, 2000.

Digital Equipment Corp., "Software Product Description, Product Name: HSC High Performance Software, Ver. 8.6," Jun. 1996. 6 pages.

"ESE50 SDI Solid State Disk Service Guide," Digital Equipment Corp., Jun. 1993. 132 pages.

International Search Report for International Application No. PCT/US20061020698, mailed Mar. 6, 2007. 16 pages.

International Search Report & the Written Opinion of the International Searching Authority, Patent Cooperation Treaty, Application No. PCT/US20071011733, Jan. 11, 2008. 13.

Notification of Transmittal of the International Preliminary Report on Patentability with mail date Aug. 12, 2008 for PCT/US2007/011733 filed May 16, 2007. 22 pages.

Non-Final U.S. Office Action with mail date Sep. 14, 2009 re U.S. Appl. No. 12/035,022, filed on Feb. 21, 2008. 23 pages.

Restriction Requirement dated Jan. 8, 2010, United States Patent & Trademark Office, U.S. Appl. No. 11/436,284, filed May 18, 2006. 7 pages.
Response to Restriction Requiremen dated Feb. 8, 2010 re U.S. Appl. No. 11/436,284 includes information Disclosure Statement. 12 pages.
Response to Non-Final Office Action dated Jan. 13, 2010, U.S. Appl. No. 12/035,022, filed Feb. 21, 2008. 19 pages.
Non-Final Office Action with mail date of May 3, 2010 re U.S. Appl. No. 11/436,284 includes Notice of References Cited and Information Disclosure Statement. 28 Pages.
Notice of Allowance and Fee(s) Due with mail date of Mar. 22, 2010 re U.S. Appl. No. 12/035,022. 8 Pages.
JP Voluntary Amendment and Petition filed Jul. 16, 2010 in JP Patent Application No. 2009-511054. 8 pages.
Response to Office Action Under 37 C.F.R. ss 1.111, dated Aug. 3, 2010, in re U.S. Appl. No. 11/436,284. 11 pages.
Notice of Allowance and Fee(s) Due with mail date of Jul. 6, 2010 for U.S. Appl. No. 12/035,022, includes Examiner-Initiated Interview Summary and Information Disclosure Statement. 22 pages.
Response to Non-Final Office Action date Aug. 3, 2010, re U.S. Appl. No. 11/436,284. 8 pages.
Final Office Action with mail date Oct. 7, 2010 re U.S. Appl. No. 11/436,284, includes Notice of References Cited and Information Disclosure Statement. 8 Pages.
Response dated Dec. 7, 2010 to the Final Office Action dated Oct. 7, 2010 re U.S. Appl. No. 11/436,284. 7 Pages.
Office Action with mail date of Dec. 14, 2010, re U.S. Appl. No. 11/436,284 re Advisory Action Before the Filing of an Appeal Brief. 3 Pages.
Shaeffer, Ian, U.S. Appl. No. 11/436,284, filed May 18, 2006, Response dated Jan. 6, 2011 to the Advisory Action, includes Request for Continued Examination. 10 Pages.
Final Office Action dated Jun. 23, 2011 for U.S. Appl. No. 11/436,284. 10 Pages.
Response dated Aug. 18, 2011 to t e Final Office Action Jun. 23, 2011 re U.S. Appl. No. 11/436,284. 16 Pages.
Petition re Premature Final Rejection dated Sep. 15, 2011 for U.S. Appl. No. 11/436,284. 7 Pages.
Shaeffer, Ian re U.S. Appl. No. 11/436,284, filed May 18, 2006 re Office Action mailed Oct. 19, 2011 granting our Petition. 4 Pages.
Shaeffer, Ian re U.S. Appl. No. 11/436,284, filed May 18, 2006 re Office Action mailed Nov. 1, 2011. 5 Pages.
Shaeffer, Ian re U.S. Appl. No. 11/436,284, filed May 18, 2006 re Response to Office Action under 37 C.F.R. ss 1.111 dated Jan. 4, 2012. 11 pages.
Shaeffer, Ian, U.S. Appl. No. 11/436,284, filed May 18, 2006, Notice of Allowance and Fee(s) Due mailed Jan. 25, 2012. 4 pages.
Shaeffer, Ian, U.S. Appl. No. 11/436,284, filed May 18, 2006, Amendment dated Apr. 9, 2012, includes Request for Continued Examination. 9 pages.
Wang et al., U.S. Appl. No. 13/398,768, filed Feb. 16, 2012, Preliminary Amendment dated Jun. 5, 2012. 9 pages.
Tsern et al., U.S. Appl. No. 12/940,942, filed Nov. 5, 2010, RCE/Response dated Apr. 11, 2012. 11 pages.
JP Office Action dated Jun. 13, 2012 re JP Application No. 2009-511054. 4 pages.
Applicant's Response of Sep. 12, 2012 to Official Communication in Japanese Patent Application No. 2009-511054, 6 pages.

* cited by examiner

MEMORY ERROR DETECTION

RELATED APPLICATION

This application is a continuation-in-part application of application Ser. No. 12/035,022, entitled "System to Detect and Identify Errors in Control Information, Read Data and/or Write Data," by inventors Ian Shaeffer, Craig Hampel, Yuanlong Wang, and Fred Ware, filed 21 Feb. 2008, which is a continuation of application Ser. No. 11/436,284, entitled "System to Detect and Identify Errors in Control Information, Read Data and/or Write Data," by inventors Ian Shaeffer and Craig Hampel, filed 18 May 2006.

BACKGROUND

The present disclosure relates generally to memory systems. More particularly, the present disclosure relates to detection and correction of errors within a memory system.

As the data transfer rate in computer systems becomes progressively faster, modern memory systems are more prone to transmission errors. Noise, crosstalk, inter-symbol interference, among other factors, can significantly impair signal quality, especially as data rates approach multiple Gbps.

BRIEF DESCRIPTION OF THE FIGURES

This disclosure is illustrated by way of example, and not by way of limitation, in the accompanying drawings. Like reference numerals refer to similar elements.

The following description is presented to enable any person skilled in the art to make and use embodiments disclosed herein, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the disclosure.

DETAILED DESCRIPTION

In a memory system, address errors can be more detrimental than data errors, because a write operation with the wrong address can corrupt previously stored data. Embodiments of the present invention provide a mechanism for checking and correcting errors in both address and data transmission between the memory controller and DRAM. The DRAM computes an error-detection code (EDC) based on the address and/or data received from the controller, and transmits this EDC code back to the controller. The controller then determines whether the EDC code is consistent with the previously transmitted address and/or data. If an error is detected, and if the error corresponds to the address for a write operation, the controller can send an error indication to the DRAM, so that the DRAM can cancel the erroneous write command. In this way, the memory system can ensure both error-resistant data and address transmission.

Embodiments of the present invention also provide various configurations to optimize different characteristics of the memory system. For example, the DRAM can compute the address-based EDC code as soon as the address is received, thereby reducing the amount of latency incurred to the data due to buffering. The DRAM also subjects the received address (and optionally the received data) to additional delays, so that there is sufficient time for the controller to detect an error based the EDC code and issue an error indication. The total delay incurred to the address and optionally the data is sufficient such that the operation corresponding to an erroneous address can be precluded from being completed. This total delay may be more than the normal WRITE or READ latency. In further embodiments, the controller can withhold the data transmission until it receives and confirms the EDC code for the corresponding address, which reduces the amount of in-DRAM data buffering.

In the present disclosure, a "memory controller" or "controller" refers to a circuit, chip, or device on a computer's motherboard or CPU die which manages the flow of data going to and from the memory. A "DRAM" refers a dynamic random-access memory. Embodiments of the present invention are not limited to DRAM-specific applications. These embodiments can also be applied to various memory systems based on dynamic or static memories. The terms "data transmission" and "data" refer to the payload data transferred between the controller and DRAM. Although the address and command bits can also be broadly referred to as data, the term "data" in this disclosure, unless specified otherwise, refers to the payload bits which are separate from address and command bits. An "error indication" is a command or a signal transmitted by the controller to a DRAM, so the DRAM can prevent a memory operation corresponding to an erroneously received address from being completed. An error indication can be a command including one or more bits, transmitted via or outside of the command bus. The error indication can also be a separate signal transmitted via one or more separate pins.

Figure 1:
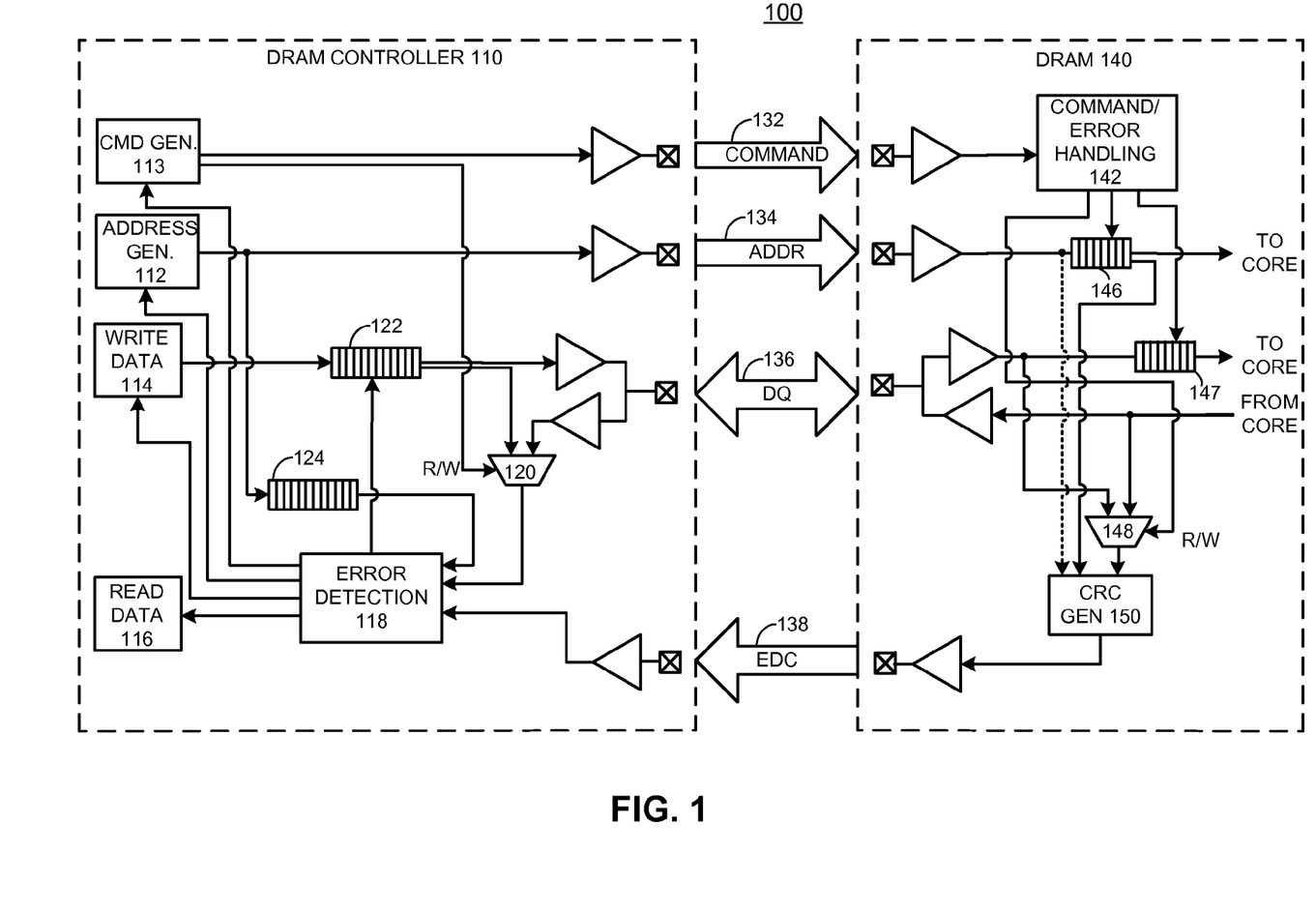
FIG. 1 illustrates an exemplary memory system which facilitates error detection for both data and address, in accordance with one embodiment of the present invention.

FIG. 1 illustrates an exemplary memory system 100 which facilitates error checking and correction for both data and address, in accordance with one embodiment of the present invention. Memory system 100 includes a DRAM controller 110, a DRAM 140, a command bus 132, an address bus 134, a data bus (DQ bus) 136, and an error-detection code (EDC) bus 138. DRAM controller 110 includes command generation circuitry 113, address generation circuitry 112, write data circuitry 114, read data circuitry 116, a write data buffer 122, an address buffer 124, a read/write selector 120, and error detection circuitry 118. DRAM 140 includes command/error handling circuitry 142, an address buffer 146, a data buffer

147, a read/write selector 148, and a cyclic-redundancy-check (CRC) code generator 150.

During operation, command generation circuitry 113 generates a memory command, e.g., a read or write command, and places the command on command bus 132. At approximately the same time, address generation circuitry 112 places an address corresponding to the memory command on address bus 134. If the command is for a write operation, write data circuitry 114 places the data for the write operation in buffer 122. In general, buffer 122 is used to delay the data transmission after the write command and address have been sent to DRAM 140, due to the write latency present in DRAM 140, i.e., the delay between the time when DRAM 140 receives the command and address and the time when DRAM 140 is ready to accept data on DQ bus 136. If command generation circuitry 113 generates a read command, a certain amount of data buffering might also be necessary to accommodate the read latency in DRAM 140.

After command generation circuitry 113 places the command on command bus 132, command/error handling circuitry 142 in DRAM 140 receives the transmitted command. In addition, the corresponding address is received and placed in buffer 146. Typically, buffer 146 buffers the received address bits because the complete address (e.g., bank address, row address, and/or column address) may be transmitted over multiple clock cycles. Furthermore, buffer 146 ensures that the address information remains available until DRAM 140 is ready to receive the write data.

Subsequently, after a certain delay (e.g., the write latency), the corresponding data is received and buffered in buffer 147. Buffer 147 buffers the received data so that buffer 147 can be later frozen or the data can be discarded if DRAM controller 110 identifies an error in the transmitted address. At a given time, the data present on DQ bus 136 might not correspond to the address and/or command present on address bus 134 and command bus 132, due to the pipelined operation of memory system 100.

The received address is first buffered by buffer 146 and then sent to CRC generator 150. In addition, the write data is sent to CRC generator 150 via read/write selector 148. Read/write selector 148 is controlled by command/error handling circuitry 142 based on the received command. If the command indicates a read operation, read/write selector 148 allows the outgoing data from the DRAM core to be sent to CRC generator 150. If the command indicates a write operation (which is the case in the current example), read/write selector 148 allows the write data to be sent to CRC generator 150.

CRC generator 150 produces a CRC code based on both the address and write data. The CRC code is then transmitted via EDC bus 138 to DRAM controller 110. CRC generator 150 can concatenate the address with the data to produce an input to the CRC computation. Other methods of generating the CRC code based on both the address and data are also possible.

In this example, the EDC code generated by DRAM 140 is a CRC code. A CRC code (or "CRC") is an error-detecting code. Its computation resembles a long division operation in which the quotient is discarded and the remainder becomes the result, with the distinction that the arithmetic used is the carry-less arithmetic of a finite field. The length of the remainder is less than or equal to the length of the divisor, which therefore determines how long the result can be. The definition of a particular CRC specifies the divisor to be used. The CRC code generated by CRC generation circuitry 150 can be based on the polynomial expression $X^8+X^2+X^1+1$. In general, a respective EDC pin in EDC bus 138 is used to carry the CRC code for the data transmitted on a number (e.g., eight) of DQ pins within DQ bus 136. There is one EDC pin for every eight DQ pins, and the CRC code is transmitted via the EDC pin over eight data-clock periods, which correspond to eight data bits transmitted over each DQ pin. That is, an eight-bit serial CRC code is transmitted over one EDC pin for 64 bits of data transmitted via eight DQ pins over eight data-clock cycles. Other EDC code schemes can also be used.

After DRAM controller 110 receives the CRC code, error detection circuitry 118 compares the CRC code with a local CRC code generated based on the buffered write data and address. Alternatively, error detection circuitry 118 can checksum the buffered write data and address concatenated with the same CRC polynomial, and determines whether the checksum result is zero. The write address is buffered in buffer 124 to compensate for the delay between the time when the address is transmitted to DRAM 140 and the time when the CRC code is received and checked at DRAM controller 110. Error detection circuitry 118 also takes as input the write or read data which corresponds to the CRC received from DRAM 140. Controller 110 maintains a set of state information to keep track of the address and data (which may be for different memory operations) corresponding to the received CRC code. The state information may be maintained by command generation circuitry 113. Upon receiving the CRC code from DRAM 140, command generation circuitry 113 determines whether the received CRC code corresponds to write or read data, and sends a signal (denoted as "R/W") to read/write selector 120. In response, read/write selector 120 selects the appropriate data (i.e., write or read) to send to error detection circuitry 118.

If the received CRC code is consistent with the selected data and address, controller 110 does not send any error indication to DRAM 140. As a result, after a predetermined period, DRAM 140 can automatically proceed with the write operation based on the address stored in buffer 146 and the corresponding write data.

Instead of transmitting an explicit error indication, controller 110 can transmit an explicit "commit" indication to DRAM 140 when the CRC code is consistent with the buffered data and address. This commit indication can be a command transmitted via or outside the command bus, or a signal transmitted over one or more separate pins. In response to the commit indication, DRAM 140 can proceed to commit the memory operation to the DRAM core. If the CRC code is inconsistent with the buffered data and address at controller 110, no commit indication is sent. As a result, after a certain time-out period, DRAM 140 can prevent the memory operation from being completed if no commit indication is received.

If error detection circuitry 118 detects an error based on the received CRC code, it can cause command generation circuitry 113 to generate and transmit an error indication to DRAM 140 via command bus 132. (The error indication can also be transmitted via one or more dedicated pins separate from command bus 132.) In response, command/error handling circuitry 142 can cause buffer 146 to remove the stored address corresponding to the error, and optionally cause buffer 147 to remove the corresponding write data. Buffer 146 can include a number of latches, and removing the stored address involves resetting these latches. In addition, in response to the error indication, command/error handling circuitry 142 can prevent the memory operation corresponding to the erroneously received address from being completed. For example, a commit of the memory operation to the memory core can be deliberately delayed sufficiently long using buffer 146 and/or buffer 147, such that controller 110 has time to detect errors and, if appropriate, abort the associated command. Subsequently, command generation circuitry 113 re-issues the corresponding memory commands. It is possible that the CRC code which identifies an error is derived from a write address and read data. In this case, the controller does not need to determine the source of the error (i.e., whether the error was incurred to the write address or read data) and can simply re-transmit all the transactions to which the erroneous CRC code corresponds.

Depending on the pipelined operations, DRAM 140 may discard a number of "in-flight" transactions (including command, address, and optionally data) received after the memory operation corresponding to the erroneous address. This approach can avoid read-after-write and write-after-write conflicts that could otherwise occur and also corrupt data in some way. In general, command/error handling circuitry 142 can discard the memory command associated with the error (or commands associated with the error if the error corresponds to more than one command due to pipelining). Command/error handling circuitry 142 can further discard any subsequently received command that can present a hazardous conflict with the command in error (for example, a read-after-write or write-after-read situation). Alternatively, command/error handling circuitry 142 can discard all the commands it has received and buffered after the erroneous command and before the first retransmitted command.

The CRC code could be generated based on address and data which belong to two or more memory operations due to the pipelined operation between controller 110 and DRAM 140. As a result, command generation circuitry 113 may need to re-issue two memory commands. Furthermore, if a write command is re-issued, the write data previously buffered in buffer 122 is sent to DRAM 140 again, in response to a signal from error detection circuitry 118 (denoted by an arrow from error detection circuitry 118 to buffer 122).

To minimize the delay between address transmission and the receiving of CRC code at controller 110, DRAM 140 can be configured to compute the CRC code as soon as the address is received, without first buffering the received address (denoted by a dotted arrow from the address flow to CRC generator 150). The CRC code can also be generated based on the address and data bits for the same memory operation. This configuration may involve additional buffering of the address, because the data transmission typically occurs after the address transmission. It is, nevertheless, not required to generate the CRC code based on the address and data corresponding to the same memory transaction, so long as both the controller and DRAM have an agreement on how to map a CRC code to the appropriate memory transaction(s).

Controller 110 can withhold the write data transmission until a CRC code corresponding to the address for the same operation is received and confirmed. This configuration may require additional buffering of the write data within controller 110. This buffering can be accomplished by buffer 122.

The example described above is described in the context of a write operation. In the case of a read operation, read/write selector 148 allows the data read from the DRAM core to be sent to CRC generator 150. In controller 110, read/write selector 120 also allows the received read data to be sent to error detection circuitry 118. If an error is detected for a read command, only the read command and the corresponding address is re-transmitted to DRAM 140, since errors in a read command, address, or data do not potentially result in irrecoverable data corruption in DRAM 140.

As noted above, there is usually write and read latency within DRAM 140. To improve system efficiency and utilization, the transfer of addresses and data between controller 110 and DRAM 140 is typically pipelined. That is, at a given moment, the bits carried on address bus 134 and the bits carried on data bus 136 may correspond to different operations. Hence, CRC generator 150 can generate CRC codes based on address and data belonging to different operations.

Figure 2A:
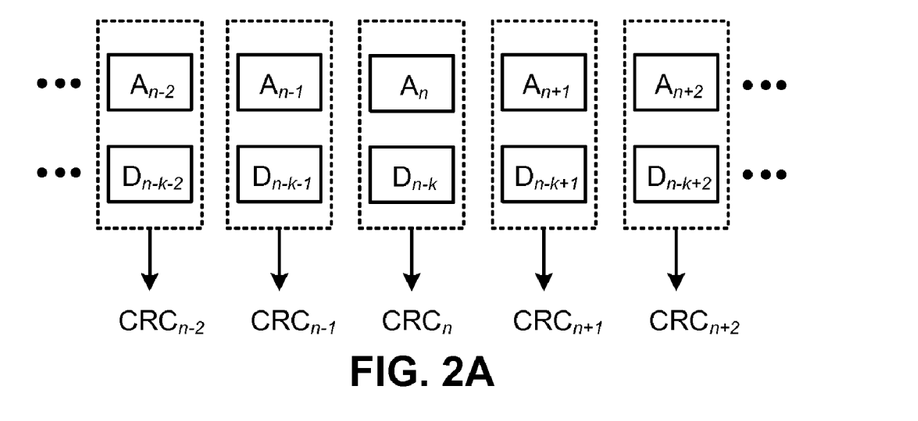
FIG. 2A presents a block diagram illustrating the process of generating EDC codes based on both data and address, in accordance with one embodiment of the present invention.

FIG. 2A presents a block diagram illustrating the process of generating a CRC code with pipelined write operations, in accordance with one embodiment of the present invention. This example shows a number of write operations, the address and data of which (denoted as "A" and "D" respectively) are indexed by a subscript which indicates their order. These write operations are pipelined in such a way that the write data for a prior operation can be present on the DQ bus when the address for the current operation is on the address bus. In FIG. 2A, the write data is assumed to lag behind the address by k memory commands. For example, when address $A_n$ is on the address bus, write data $D_{n-k}$ is on the DQ bus. As a result, the CRC generator within the DRAM can generate a CRC code, $CRC_n$, based on $A_n$ and $D_{n-k}$. k can be any integer, such as 0, 1, 2, 3, etc.

The value of k represent the about of lag of data behind the corresponding address. In addition to the write or read latency inherent in the DRAM, k can also include artificially injected buffering delay to the data to accommodate the time required to generate the CRC code, process the CRC code at the controller, and to issue an error indication by the controller. This way, the buffered memory command can be aborted before the data is committed to the DRAM core.

When k is zero, the data on the DQ bus is substantially aligned with the address on the address bus and they correspond to the same memory operation. However, in such a configuration, the DRAM may need to provide sufficient in-DRAM buffering for the write data to accommodate the write latency. One advantage of having the data and address aligned (i.e., corresponding to the same memory command) for generating the CRC code is that when an error is detected, the DRAM only needs to abort and/or re-issue the memory command corresponding to that error. When the data and address are not aligned (i.e., k is greater than zero), the controller might not be able to determine whether the error in the CRC corresponds to the data or address. As a result, the DRAM might need to abort multiple commands corresponding to the address and data, respectively. The controller might also need to re-issue these commands.

It is possible that sometimes the DQ bus is not always busy, and a given CRC code might be generated based only on an address, whereas the data portion of the input for the CRC is of a null value. In this case, the DRAM only needs to abort the command corresponding to the address if an error is detected in the CRC code.

Figure 2B:
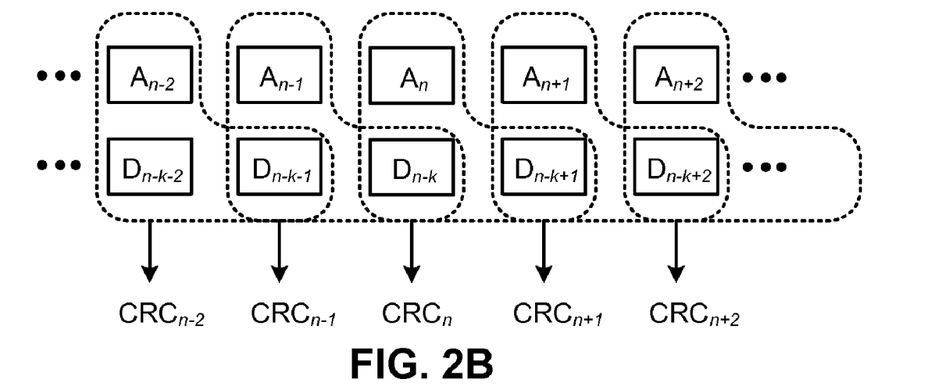
FIG. 2B presents a block diagram illustrating the process of generating EDC codes based on both data and address, in accordance with one embodiment of the present invention.

In the example in FIG. 2B, a CRC code, $CRC_n$, is generated based on $A_n$, $D_{n-k}$, and $D_{n-k+1}$. In other words, a particular CRC is generated based on not only the address and data present on the address bus and DQ bus, but also on the data corresponding to the previous memory command. This method can allow the controller to determine whether an error in $CRC_n$ is caused by an error in $A_n$, $D_{n-k}$, or $D_{n-k+1}$. For example, if $CRC_n$ is in error, but $CRC_{n+1}$ and $CRC_{n-1}$ are both correct, then $A_n$ is in error. If $CRC_n$ and $CRC_{n-1}$ are both in error but $CRC_{n+1}$ and $CRC_{n-1}$ are correct, then it is possible that $D_{n-k}$ and/or $A_n$ are in error.

Other methods are possible to allow the controller to determine whether a CRC error is caused by an address error or data error. For example, the DRAM can generate CRC codes for the data and address separately, and transmit both CRC codes to the controller.

The description below provides further explanation of the operations of the DRAM and controller, and exemplary timing diagrams of different embodiments.

Figure 3:
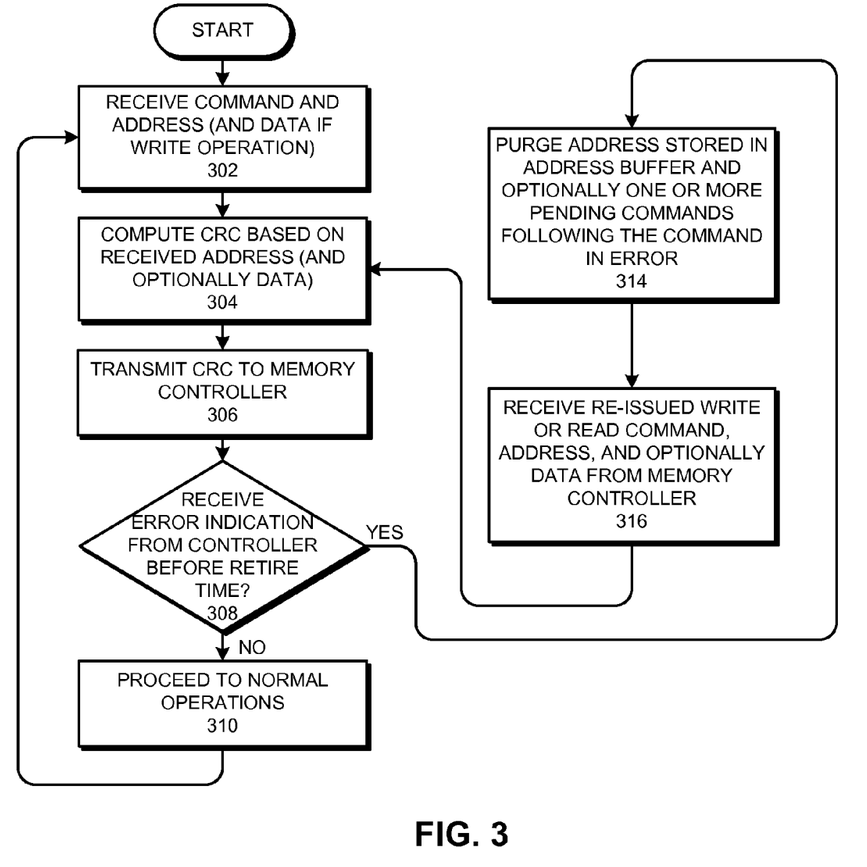
FIG. 3 presents a flowchart illustrating the operation of a dynamic random-access memory (DRAM) which facilitates EDC for both address and data, in accordance with one embodiment of the present invention.

FIG. 3 presents a flowchart illustrating the operation of a DRAM which facilitates EDC for both address and data, in accordance with one embodiment of the present invention. In this example, the DRAM first receives a command and the corresponding address (operation 302). The DRAM can also receive write data if the command is for a write operation, wherein the write data may or may not correspond to the write command and address due to pipelined operations. Subsequently, the DRAM computes a CRC code based on the received address and optionally the data (operation 304). The data could be write data (incoming) or read data (outgoing). The DRAM then transmits the CRC code to the memory controller (operation 306).

Next, the DRAM determines whether it has received an error indication from the controller before a given time (referred to as "retire time") (operation 308). If the DRAM does not receive the error indication before the retire time, the DRAM proceeds with normal operations, such as write, read, active, refresh, and other register-related operations (operation 310). If an error indication is received, the DRAM purges the address corresponding to the error from the address buffer and optionally one or more pending commands following the command in error (operation 314). Subsequently, the DRAM receives a re-issued write or read command, the address, and optionally data (if the re-issued command is for a write operation) from the controller (operation 316). The DRAM then proceeds to handle the re-issued command (operation 304).

Figure 4:
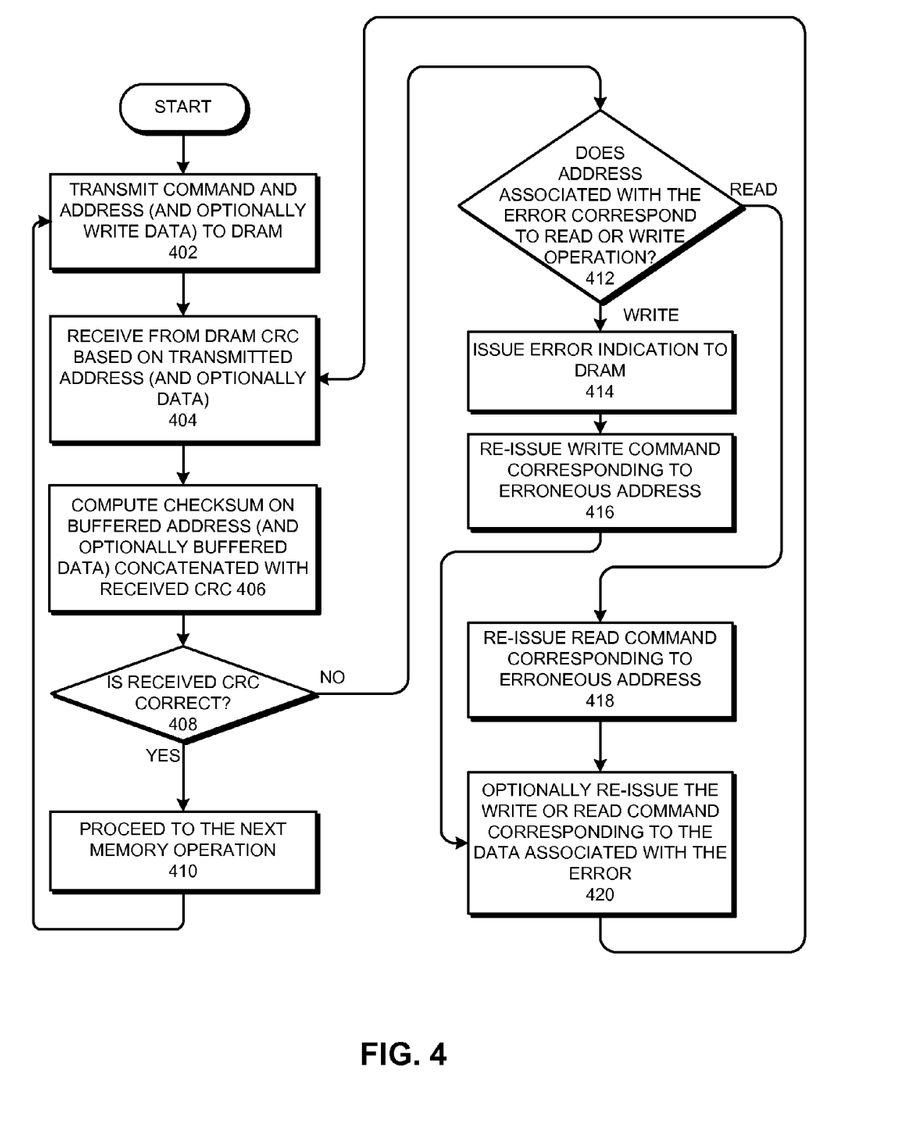
FIG. 4 presents a flowchart illustrating the operation of a memory controller which facilitates EDC for both address and data, in accordance with one embodiment of the present invention.

FIG. 4 presents a flowchart illustrating the operation of a memory controller which facilitates EDC for both address and data, in accordance with one embodiment of the present invention. In this example, the memory controller first transmits a command and address, and optionally write data to the DRAM (operation 402). Subsequently, the controller receives from the DRAM a CRC code based on the transmitted address and optionally write or read data (operation 404). The controller then performs the checksum computation on the buffered address (and optionally buffered data) concatenated with the received CRC code (operation 406). A correct CRC code would produce zero as the checksum result. Alternatively, the controller can generate its own CRC code and compare it with the received CRC code. The address and optionally the data and command used to generate the CRC code should be the same as the ones used to check the CRC code. However, they do not need to be for the same memory transaction.

Next, the controller determines whether received CRC code is correct (operation 408). If the CRC codes is correct, the controller proceeds to the next memory operation (operation 410). If the CRC code is incorrect, the controller further determines whether the address associated with the error corresponds to a read or write operation (operation 412).

If the address error corresponds to a write operation, the controller issues an error indication to the DRAM (operation 414). This error indication notifies the DRAM that it should discard or abort the commands for the previously stored erroneous address, and, if the corresponding write data has already been transmitted to the DRAM, discard the buffered write data as well. Subsequently, the controller re-issues the write command corresponding to the erroneous address (operation 416). Optionally, if the CRC code from the DRAM is based on address and data belonging to two different memory operations, the controller can re-issue the write or read command corresponding to the data portion (as opposed to the address portion) associated with the error (operation 420).

In a further embodiment, instead of sending an explicit error indication to the DRAM when the CRC is incorrect, the controller can send an explicit commit indication when the CRC is correct. This commit indication allows the DRAM to proceed with the buffered command and complete the memory operation. Correspondingly, if the CRC is incorrect, the controller does not transmit the commit indication, and the DRAM discards the command in error (and optionally additional pending commands received after the command in error) after a predetermined time-out period.

If the erroneous data portion is for a previously issued write command, it is not necessary for the controller to issue an error indication to the DRAM to discard the erroneous data, because the erroneous data will still be written to the correct address and will not corrupt good data stored elsewhere. The controller only needs to re-issue the write command to place the correct data in the same address. To illustrate this situation more clearly, take the example in FIG. 2. Suppose address $A_n$ and data $D_{n-k}$ are for two separate write commands. Also, suppose $CRC_n$ indicates an error. The controller then assumes that both write commands respectively corresponding to $A_n$ and $D_{n-k}$ had erroneous transmission. However, the controller only needs to issue an error indication for the write operation corresponding to $A_n$, so that the DRAM can purge the stored erroneous address $A_n'$. The controller does not have to issue an error indication for the write operation corresponding to $D_{n-k}$, because even if the erroneous data is written to the DRAM core, it can be corrected by a re-issued write command, since there is no address error associated with $D_{n-k}$. This is based on the assumption that the controller does not issue a read command immediately following the erroneous write command to the same address. The controller can ensure this does not happen by comparing the address of pending read operations with the erroneous write operation and holding the read operations until the correct write data is committed. Alternatively, the controller can return the correct read data based on the data buffered within the controller, without addressing the DRAM at all.

Now, with reference back to operation 412 in FIG. 4, if the controller determines that the address associated with the error corresponds to a read operation, the controller re-issues the read command corresponding to the erroneous address (operation 418). The controller can optionally re-issue the write or read command corresponding to the data portion associated with the error (operation 420). Subsequently, the controller proceeds to receive the next CRC code from the DRAM (operation 404).

Note that although the above example is directed to erroneous read and write operations, the same method can be applied to other types of operations, such as activate, refresh, and other register-related operations. In general, this method can be applied to any memory operation that involves transmission of an address.

Figure 5:
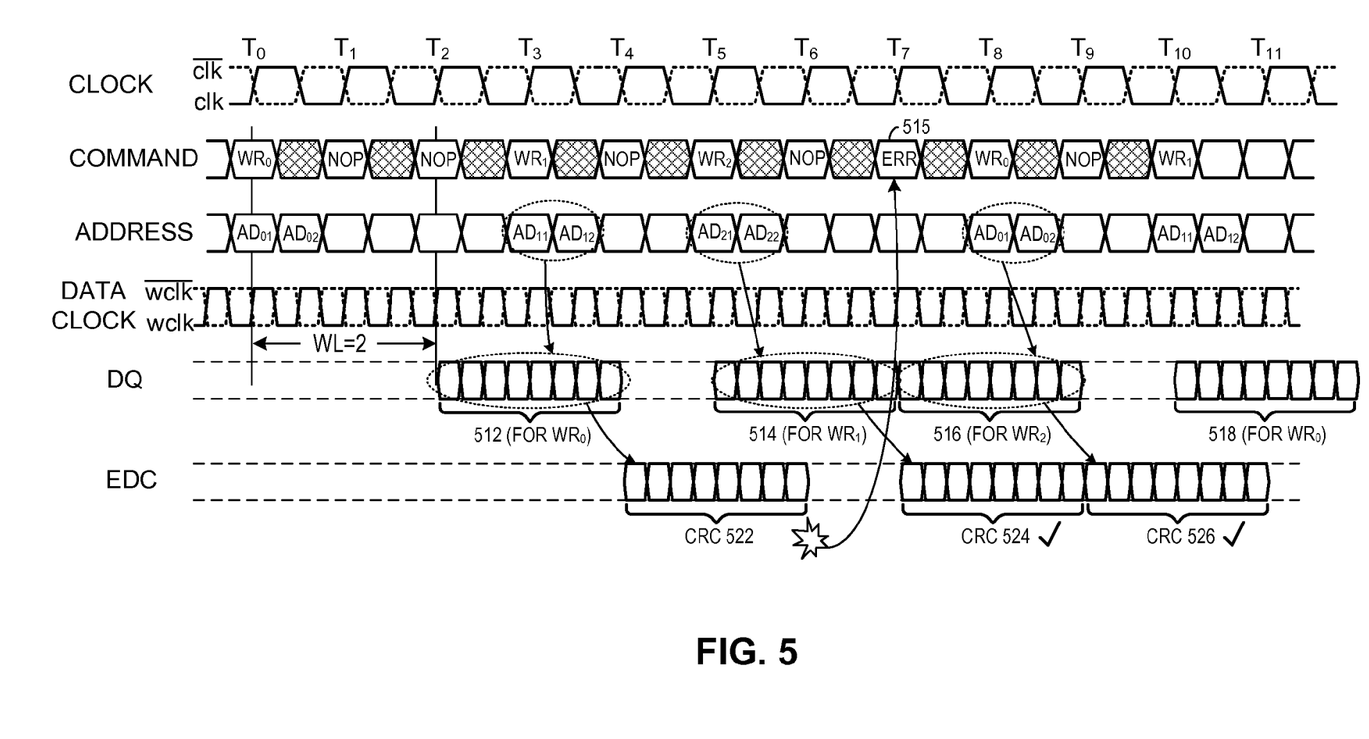
FIG. 5 presents an exemplary timing diagram illustrating the operation between a memory controller and a DRAM to facilitate address and data EDC, in accordance with one embodiment of the present invention.

FIG. 5 presents an exemplary timing diagram illustrating the operation between a memory controller and a DRAM to facilitate address and data EDC, in accordance with one embodiment of the present invention. In this example, the clock and inverted clock signals are denoted as "clk" and "$\overline{\text{clk}}$" respectively. Each clock cycle is denoted as $T_i$. The command can be transmitted at every rising edge of clk, and address can be transmitted at every rising edge of clk and $\overline{\text{clk}}$. In other words, the data rate of address transmission is twice that of command transmission. The data clock used in this example is twice as fast as the clock for command and address transmission. Here, the data clock and inverted data clock signals are denoted as "wclk" and "$\overline{\text{wclk}}$" respectively. The data bits on the DQ bus and the CRC bits on the EDC bus are transmitted at every rising edge of wclk and $\overline{\text{wclk}}$. Hence, the data rate of DQ and EDC is four times the data rate of the command bus and twice the data rate of the address bus.

In this example, at clock cycle $T_0$, the controller issues a write command $WR_0$, and places the corresponding addresses, $AD_{01}$ and $AD_{02}$, on the address bus. Assume that the DRAM has a write latency of two clock cycles (i.e., WL=2). The corresponding write data burst 512 is placed on the DQ bus at clock cycle $T_2$. Assume that each write data burst is eight bits long. Hence, data burst 512 occupies clock cycles $T_2$ and $T_3$. Meanwhile, at $T_3$, the controller issues the next write command $WR_1$ and the corresponding addresses $AD_{11}$ and $AD_{12}$. $AD_{11}$ and $AD_{12}$ are received by the DRAM at approximately the same time as data burst 512 (which is the write data for $WR_0$). The DRAM concatenates $AD_{11}$ and $AD_{12}$ with data burst 512, generates a CRC code 522, and places CRC code 522 on the EDC bus at $T_4$.

While the controller receives CRC code 522, the controller continues to issue the next write command, $WR_2$, and its corresponding address $AD_{21}$ and $AD_{22}$ at $T_5$. In addition, at $T_5$, the controller places data burst 514, which is the write data for $WR_1$, on the DQ bus.

After receiving CRC code 522, the controller detects an error (indicated by a star), and issues an error indication 515 to the DRAM at $T_7$. Error indication 515 corresponds to the write command $WR_1$ and allows the DRAM to discard the erroneously received addresses $AD_{11}$ and $AD_{12}$. Subsequent to error indication 515, the controller re-issues $WR_0$ and $WR_1$ at $T_8$ and $T_{10}$, respectively. The controller does not need to issue an error indication for $WR_0$, if the address of $WR_0$ has been received correctly by the DRAM and there is no potential data hazard between $WR_0$ and $WR_1$. In response to error indication 515, the DRAM can discard the buffered address $AD_{01}$ and $AD_{02}$, and optionally buffered data burst 512.

Meanwhile, at $T_7$, the controller places data burst 516, which is the write data corresponding to $WR_2$, on the DQ bus. On the DRAM side, after receiving data burst 514, the DRAM concatenates $AD_{21}$ and $AD_{22}$ with data burst 514 and generates CRC code 524. Subsequent to data burst 514, the controller transmits data burst 516, which is the write data for $WR_2$. At $T_{10}$, the controller transmits data burst 518, which is the write data for the re-issued $WR_0$.

Because data bursts 514 and 516 are received at the DRAM back-to-back, the DRAM also generates CRC code 526 based on $AD_{01}$, $AD_{02}$, and data burst 516. $AD_{01}$ and $AD_{02}$ at $T_8$ correspond to the re-issued $WR_0$. Since the controller does not find any error in CRC codes 524 and 526 (indicated by a check mark), the controller does not perform any additional operations with respect to these CRC codes.

In this example, there are seven clock cycles between the time when the address for $WR_0$ ($AD_{01}$ and $AD_{02}$) is placed on the address bus and the time when error indication 515 is issued. Correspondingly, these addresses are buffered in the DRAM for seven clock cycles in order for the DRAM to abort them in response to an error indication. This buffer delay is longer than the DRAM's normal write latency, which is two clock cycles. This buffering can be provided by buffer 146 in the system illustrated in FIG. 1. If the time required for the DRAM to compute the CRC and for the controller to check the CRC and issue an error indication is deterministic, the amount of buffering for the received address can also be determined. Furthermore, the DRAM can include a mechanism that determines this total latency required for the CRC check and configure the buffer automatically during a start-up sequence, such that the received addresses are buffered sufficiently long to allow the CRC check and error notification.

Figure 6:
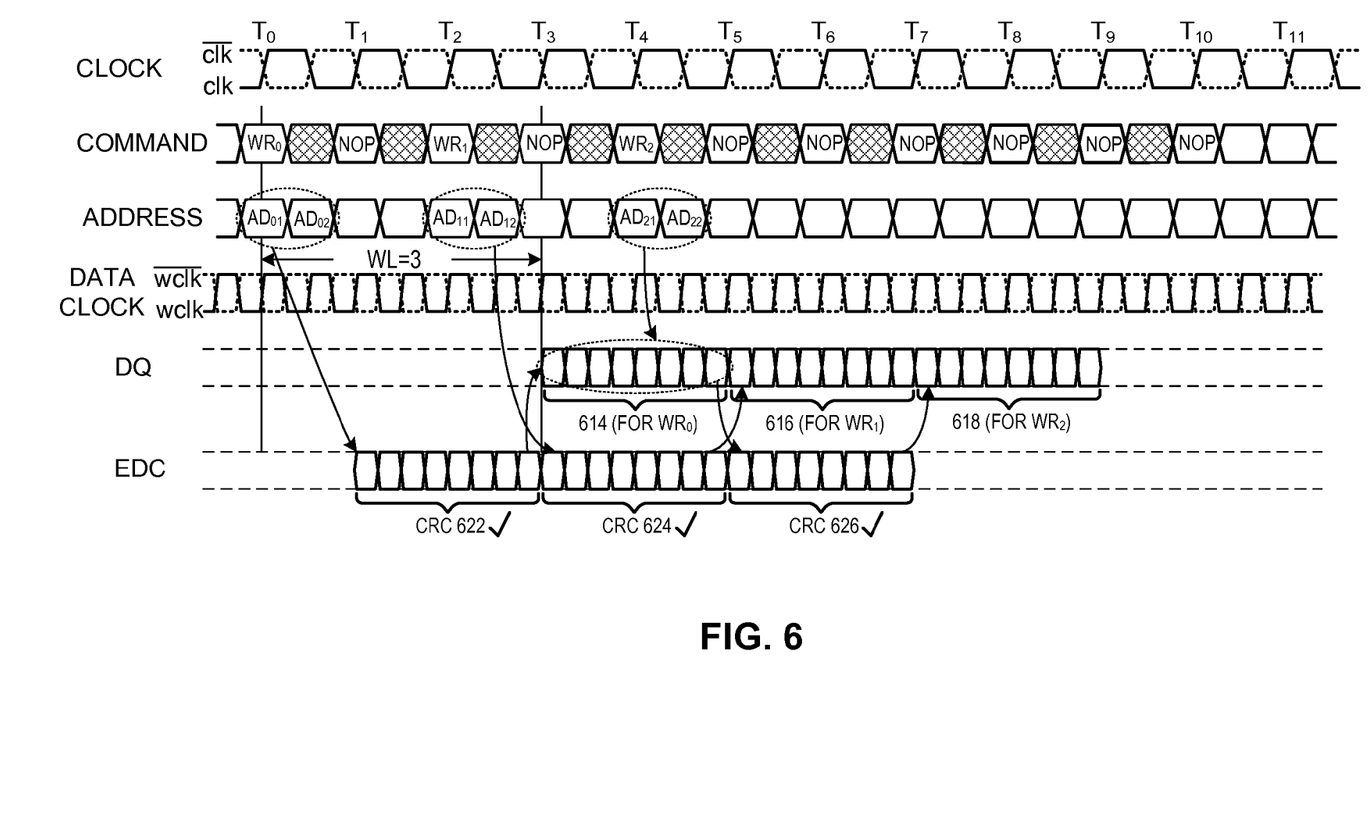
FIG. 6 presents an exemplary timing diagram illustrating the operation between a memory controller and a DRAM to facilitate address and data EDC, in accordance with one embodiment of the present invention.

FIG. 6 presents an exemplary timing diagram illustrating the operation between a memory controller and a DRAM to facilitate address and data EDC, in accordance with one embodiment of the present invention. In this example, the controller is configured to transmit the write data after the corresponding write address is confirmed to have been received successfully at the DRAM. The write latency in this example is assumed to be three clock cycles (i.e., WL=3).

As illustrated in FIG. 6, at $T_0$, the controller issues the first write command $WR_0$ and the corresponding addresses, $AD_{01}$ and $AD_{02}$. Based on $AD_{01}$ and $AD_{02}$, the DRAM generates CRC code 622. Subsequently, the controller determines that CRC code 622 is error-free, and transmits data burst 614, which is the write data for $WR_0$. Similarly, the DRAM generates CRC code 624 based on $AD_{11}$ and $AD_{12}$. Upon receiving and confirming CRC code 624, the controller transmits data burst 616, which is the write data corresponding to $WR_1$.

Data burst 614 is transmitted at $T_3$. Since data burst 614 lasts two full clock cycles (i.e., from $T_3$ to $T_5$), which coincide with the transmission of $WR_2$, $AD_{21}$, and $AD_{22}$, the DRAM can first buffer $AD_{21}$ and $AD_{22}$ and then concatenate them with data burst 614 to produce CRC code 626. Upon receiving and confirming CRC code 626, the controller proceeds to transmit data burst 618, which is the write data corresponding to $WR_2$.

In the example above, the DRAM generates a CRC code based on the received address as soon as the address is received, provided there is no data being received on the DQ bus. The controller would withhold the write data transmission until the CRC code corresponding to the write address is received and confirmed. However, when the DRAM receives addresses and data at the same time (for example, data burst 614, $AD_{21}$, and $AD_{22}$), the DRAM can first buffer the address and then generate the CRC code based on both the address and received data.

Although the description uses read and write operations as examples, the methods disclosed herein are not limited to these operations. In general, the present address error-detection mechanisms are applicable with any memory operation that involves an address transmission.

The components of the address error detection mechanism described above can include any collection of computing components and devices operating together. These components can also be components or subsystems in a larger computer system or network. Components of an address error detection mechanism can also be coupled among any number of components (not shown), for example, buses, controllers, memory devices, and data input/output (I/O) devices, in any number of combinations. Many of these system components may be situated on a common printed circuit board or integrated circuit, or may be integrated in a system that includes several printed circuit boards or ICs that are coupled together in a system, for example, using connector and socket interfaces such as those employed by personal computer motherboards and dual inline memory modules ("DIMM"). In other examples, complete systems may be integrated in a single package housing using a system in package ("SIP") type of approach. Integrated circuit devices may be stacked on top of one another and utilize wire bond connections to effectuate communication between devices or may be integrated on a single planar substrate in the package housing.

Further, functions of an address error detection mechanism can be distributed among any number/combination of other processor-based components. The address error detection mechanism described above can be applied in, for example, various DRAM systems. As examples, the DRAM memory systems can include DDR systems like DDR SDRAM, as well as DDR2 SDRAM, DDR3 SDRAM, and other DDR SDRAM variants, such as Graphics DDR ("GDDR") and further generations of these memory technologies, including GDDR2, GDDR3, GDDR4, and GDDR5, but are not limited to these memory systems.

Aspects of the address error detection mechanisms described herein may be implemented as functionality programmed into any of a variety of circuitry, including programmable logic devices (PLDs), such as field programmable gate arrays (FPGAs), programmable array logic (PAL) devices, electrically programmable logic and memory devices, and standard cell-based devices, as well as application specific integrated circuits (ASICs). The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The foregoing descriptions of embodiments described herein have been presented only for purposes of illustration and description. They are not intended to be exhaustive or to limit the embodiments to the forms disclosed. Accordingly, many modifications and variations will be apparent to practitioners skilled in the art.

Moreover, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory device, comprising:
    address-receiving circuitry to receive an address for a memory operation;
    address-storage circuitry to store the received address for the memory operation;
    error-management circuitry to generate an error-detection code based on the received address for the memory operation;
    communication circuitry to communicate the error-detection code to a memory controller;
    indication-receiving circuitry to receive an error indication from the memory controller in response to the communicated error-detection code that indicates an error in the received address for the memory operation; and
    error-handling circuitry to prevent the memory operation from being completed in response to the received error indication.

2. The memory device of claim 1, further comprising a buffering mechanism to buffer the received address for an amount of time that is at least sufficient for the indication-receiving circuitry to receive the error indication.

3. The memory device of claim 2, wherein the time for which the received address is buffered is longer than a write latency or read latency inherent to the memory device.

4. The memory device of claim 1, wherein while preventing the memory operation from being completed, the error-handling circuitry aborts a received command corresponding to the memory operation and writing over the received address with a correct address.

5. The memory device of claim 1, wherein while preventing the memory operation from being completed, the error-handling circuitry discards one or more memory commands associated with the error.

6. The memory device of claim 5, wherein while preventing the memory operation from being completed, the error-handling circuitry further discards a memory command received subsequent to the command associated with the error.

7. The memory device of claim 1,
    wherein the error-detection code is a cyclic redundancy-check (CRC) code.

8. The memory device of claim 7,
    wherein the error-management circuitry generates the CRC code based on the received address and data received on at least one data bus.

9. The memory device of claim 1,
    wherein the address-storage circuitry comprises one or more latches; and
    wherein while preventing the memory operation from being completed, the error-handling circuitry resets the latches in the address-storage circuitry.

10. The memory device of claim 1, further comprising buffer circuitry to buffer data received on at least one data bus;
    wherein the error-handling circuitry discards the data buffered in the buffer circuitry when the error indication is received.

11. The memory device of claim 1, wherein the memory operation is a WRITE or READ operation.

12. A method for detecting an address error in a memory system, the method comprising:
    receiving at a memory device an address for a memory operation;
    storing the received address for the memory operation;
    generating an error-detection code based on the received address for the memory operation;
    communicating the error-detection code to a memory controller;
    receiving an error indication from the memory controller in response to the communicated error-detection code that indicates an error in the received address for the memory operation; and
    preventing the memory operation from being completed in response to the received error indication.

13. A memory device, comprising:
    address-receiving circuitry to receive an address on at least one address bus;
    data-receiving circuitry to receive data on at least one data bus; and
    error-management circuitry to generate a CRC code based on the received address and data, wherein the data does not correspond to a memory operation associated with the address.

14. The memory device of claim 13, wherein the error-management circuitry concatenates the address with the data to generate the CRC code.

15. A method for detecting an address error in a memory system, the method comprising:
    receiving an address on at least one address bus;
    receiving data on at least one data bus; and
    generating a CRC code based on the received address and data, wherein the data does not correspond to a memory operation associated with the address.

16. A memory controller, comprising:
address-transmission circuitry to transmit an address for a memory operation;
error-detection-code receiving circuitry to receive an error-detection code corresponding to the transmitted address from a memory device;
error-detection circuitry to detect an error based on the received error-detection code and the transmitted address; and
error-indication transmission circuitry to transmit an error indication to the memory device in response to the error-detection circuitry detecting the error, to prevent the memory operation corresponding to the transmitted address from being completed.

17. The memory controller of claim 16, further comprising a data buffer to buffer data for the memory operation prior to transmitting the address.

18. The memory controller of claim 16, further comprising:
an address buffer to buffer the transmitted address; and
address re-transmission circuitry to re-transmit the buffered address in response to the error-detection circuitry detecting the error.

19. The memory controller of claim 16, wherein the memory operation is a WRITE or READ operation.

20. The memory controller of claim 16, wherein the error-detection code is a CRC code based on the transmitted address.

21. A method for detecting an address error in a memory system, the method comprising:
transmitting an address for a memory operation;
receiving an error-detection code corresponding to the transmitted address from a memory device;
detecting an error based on the received error-detection code and transmitted address;
transmitting an error indication to the memory device in response to the detected error, to prevent the memory operation corresponding to the transmitted address from being completed.

22. A memory system, comprising:
a memory device;
a memory controller; and
an address bus which couples the memory device with the memory controller;
wherein the memory device generates an error-detection code based on an address received via the address bus and transmits the error-detection code to the memory controller;
wherein the memory controller transmits an error indication to the memory device in response to the error-detection code; and
wherein the error indication causes the memory device to discard the received address and prevent a memory operation.

23. The memory system of claim 22, wherein the memory controller comprises a data buffer which buffers the data associated with a memory operation corresponding to the transmitted address.

24. The memory system of claim 22, wherein the memory device comprises a data buffer which buffers the data associated with a memory operation corresponding to the transmitted address.

25. The memory system of claim 22, wherein the memory controller comprises an address buffer which buffers the transmitted address and re-transmits the buffered address after the error indication is transmitted.

26. The memory system of claim 22, wherein the memory system is a Graphics Double Data Rate, version 5 (GDDR5) memory system.

27. A memory system, comprising:
a memory controller;
a memory device; and
a signal path coupling the memory controller and the memory device, wherein the signal path carries an error indication that is transmitted from the memory controller to the memory device, and wherein the error indication causes the memory device to prevent a previously transmitted command from being completed.

28. A memory device, comprising:
means for receiving an address for a memory operation;
means for storing the received address for the memory operation;
means for generating an error-detection code corresponding to the received address;
means for communicating the error-detection code to a memory controller;
means for receiving an error indication from the memory controller in response to the error detection code that indicates an error in the received address for the memory operation; and
means for preventing the memory operation from being completed in response to the received error indication.

29. A memory device, comprising:
means for receiving an address on at least one address bus;
means for receiving data on at least one data bus; and
means for generating a CRC code based on the received address and data, wherein the data does not correspond to a memory operation associated with the address.

30. A memory controller, comprising:
means for transmitting an address for a memory operation;
means for receiving an error-detection code corresponding to the transmitted address from a memory device;
means for detecting an error based on the received error-detection code and the transmitted address; and
means for transmitting an error indication to the memory device, in response to the error-detection circuitry detecting the error, to prevent the memory operation corresponding to the transmitted address from being completed.

* * * * *